(12) United States Patent
Suzuki

(10) Patent No.: US 7,439,781 B2
(45) Date of Patent: Oct. 21, 2008

(54) POWER DETECTION CIRCUIT FOR NON-CONTACT IC CARD OR RFID TAG

(75) Inventor: Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 91 days.

(21) Appl. No.: 11/359,496

(22) Filed: Feb. 23, 2006

(65) Prior Publication Data

US 2007/0024333 A1 Feb. 1, 2007

(30) Foreign Application Priority Data

Jul. 28, 2005 (JP) ............................. 2005-218728

(51) Int. Cl.
*H03L 7/00* (2006.01)
(52) U.S. Cl. ...................... 327/143; 327/142; 327/198
(58) Field of Classification Search ................. 327/143, 327/198, 142
See application file for complete search history.

(56) References Cited

U.S. PATENT DOCUMENTS

| 5,528,182 | A | | 6/1996 | Yokosawa | |
|---|---|---|---|---|---|
| 5,930,129 | A | | 7/1999 | Sugimura | |
| 6,144,238 | A | * | 11/2000 | Dasgupta | 327/143 |
| 6,469,477 | B2 | * | 10/2002 | Sugimura | 323/265 |
| 6,597,215 | B2 | * | 7/2003 | Wang | 327/143 |
| 6,683,481 | B1 | * | 1/2004 | Zhou et al. | 327/143 |
| 7,142,024 | B2 | * | 11/2006 | Youssef | 327/143 |
| 2003/0214329 | A1 | * | 11/2003 | Shin | 327/143 |
| 2004/0212409 | A1 | * | 10/2004 | Akamatsu et al. | 327/143 |
| 2005/0057287 | A1 | * | 3/2005 | Gossmann | 327/143 |

FOREIGN PATENT DOCUMENTS

| JP | 2-254811 A | 10/1990 |
|---|---|---|
| JP | 3-141415 A | 6/1991 |
| JP | 07-046106 | 2/1995 |
| JP | 9-270686 A | 10/1997 |
| JP | 11-68539 A | 3/1999 |

OTHER PUBLICATIONS

Japanese Office Action Aug. 5, 2008, 2 pages.

* cited by examiner

*Primary Examiner*—Kenneth B. Wells
*Assistant Examiner*—John W Poos
(74) *Attorney, Agent, or Firm*—Arent Fox LLP

(57) ABSTRACT

A power detection circuit has a first comparator block, a charge controller block, and a second comparator block. The first comparator block compares a supply voltage with a first threshold value, and the charge controller block controls the charging of a first capacitor according to an output signal of the first comparator block. The second comparator block compares the charge in the first capacitor with a second threshold value so as to produce a power detection signal, and wherein a second capacitor is interposed between the charge controller block and the first capacitor.

6 Claims, 3 Drawing Sheets

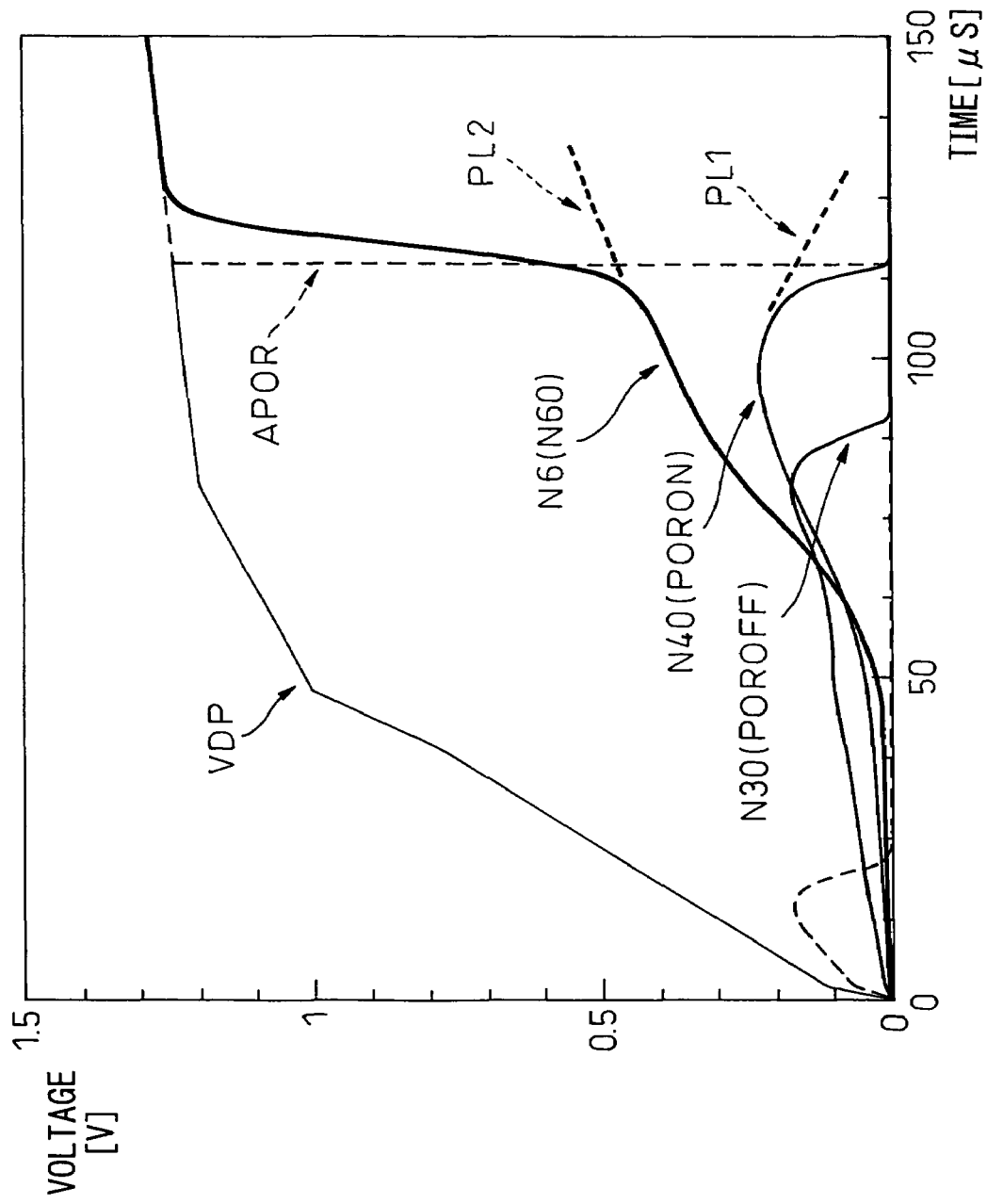

POWER DETECTION CIRCUIT FOR NON-CONTACT IC CARD OR RFID TAG

CROSS REFERENCE TO RELATED APPLICATION

This application is based upon and claims the benefit of priority from the prior Japanese Patent Application No. 2005-218728, filed on Jul. 28, 2005, the entire contents of which are incorporated herein by reference.

BACKGROUND OF THE INVENTION

1. Field of the Invention

The present invention relates to a power detection circuit and, more particularly, to a power detection circuit to be incorporated in a non-contact IC card or a radiofrequency (RF) identification (ID) tag.

2. Description of the Related Art

In recent years, a non-contact IC card and an RFID tag have been widely used. A power detection circuit is requested to cope with a wide range of rise times, which is needed by a power supply incorporated in the non-contact IC card or RFID tag, and to reliably produce a Power On Reset (POR) signal.

A power detection circuit is applied not only to a non-contact IC card and an RFID tag that utilize a non-contact power transmission technology for transmitting power via an antenna but also to various pieces of electronic equipment that control a power supply according to a Power On Reset signal.

The non-contact IC card and RFID tag receive supply of power by radio waves, and internally rectifies the power so as to produce a supply voltage. The positional relationship of a reader writer to the non-contact IC card or RFID tag may vary, and the condition of radio waves varies depending on an ambient environment. The rise time needed by power (a supply voltage) varies depending on a situation but does not remain uniform.

On the other hand, after the power supply of a system is turned on, the system must be initialized in any way. If initialization is imperfect or is not performed, the system may malfunction or may fail.

Therefore, a power detection circuit (Power On Reset (POR) circuit) that produces a POR signal with which a system is initialized after the power supply of the system is turned on has come to play a pivotal role in the non-contact IC card or RFID tag. The present invention is implemented not only in the power detection circuit to be incorporated in the non-contact IC card or RFID tag but also in the power detection circuit to be incorporated in various pieces of electronic equipment.

By the way, for example, Japanese Unexamined Patent Publication (Kokai) No. 03-141415 has disclosed a Power On Reset circuit (power detection circuit) to be incorporated in a MOS-like semiconductor integrated circuit that transmits a Reset signal according to a difference potential between a signal produced as a fraction of a supply voltage using a plurality of MOS transistors and a plurality of resistors and a signal produced as a fraction thereof using two resistors.

Further, for example, Japanese Unexamined Patent Publication (Kokai) No. 02-254811 has disclosed a Reset circuit that resets a logic circuit, which is included in an integrated circuit in which both analog and logic circuits coexist, without using any external part such as an external terminal or capacitor in a state in which the integrated circuit is initialized after the power supply is turned on.

Moreover, for example, Japanese Unexamined Patent Publication (Kokai) No. 09-270686 has disclosed a Power On Reset circuit comprising a charge circuit composed of a resistor and a capacitor; a CMOS inverter that generates a Reset signal until a voltage applied in order to charge the capacitor included in the charge circuit exceeds a predetermined value; a switch that controls a supply voltage to be applied to the charge circuit; an operational voltage designation circuit that designates a voltage with which the switch is activated; a discharge circuit that discharges the charge circuit after the power supply is turned off; and a clamp circuit that retains the switch in an on state after charge is completed. The Power On Reset circuit operates stably irrespective of whether a rise time needed after the power supply is turned on is long or short, and contributes to low power consumption.

In addition, for example, Japanese Unexamined Patent Publication (Kokai) No. 11-068539 has disclosed a simple Power On Reset circuit capable of reliably producing a one-shot pulse irrespective of whether a supply voltage obtained from a power supply after the power supply is turned on needs a long rise time. The Power On Reset circuit includes: a voltage sense means, a shutoff circuit; a supply voltage sense circuit that senses application of a supply voltage when the shutoff circuit is in an on state; a conduction means that conducts a current according to a sense voltage; a capacitor that holds charge, which is received via the conduction means, proportionally to a time constant; a capacitor charge time constant circuit that includes a discharge means; and an output circuit. The Power On Reset circuit applies a voltage, which develops at a second node, as a feedback voltage to the shutoff circuit.

The prior art and its associated problem will be described in detail later with reference to relevant drawings.

SUMMARY OF THE INVENTION

An object of the present invention is to provide a power detection circuit capable of reliably producing a Power On Reset signal. Another object of the present invention is to provide a power detection circuit capable of suppressing unnecessary power consumption caused by a penetrating current.

According to the present invention, there is provided a power detection circuit comprising a first comparator block comparing a supply voltage with a first threshold value; a charge controller block controlling the charging of a first capacitor according to an output signal of the first comparator block; and a second comparator block comparing the charge in the first capacitor with a second threshold value so as to produce a power detection signal, wherein a second capacitor is interposed between the charge controller block and the first capacitor.

The charge controller block may include a charging first-conductivity type MOS transistor having a first terminal thereof connected onto a first-potential power line, a second terminal thereof connected to one terminal of the first capacitor having the other terminal thereof connected onto a second-potential power line, and a first output signal, which is transferred from the first comparator block, applied to a control terminal thereof so as to control the charging of the first capacitor. The charge controller block may include a discharging second-conductivity type MOS transistor having a first terminal thereof connected onto the second-potential power line, a second terminal thereof connected to one terminal of the first capacitor, and a second output signal, which is transferred from the first comparator block, applied to a control terminal thereof so as to control the discharging of the first capacitor.

The power detection circuit may further comprise a voltage divider block dividing the supply voltage using resistors so as to provide first-potential and second-potential signals. The first comparator block may include a first inverter comparing the first potential with a threshold voltage so as to provide a charge control signal, and a second inverter comparing the second potential with a threshold voltage so as to provide a discharge control signal.

The power detection circuit may further comprise a first adjustment second-conductivity type MOS transistor having a first terminal thereof connected onto the second-potential power line, a second terminal thereof connected to the control terminal of the charging first-conductivity type MOS transistor, and a control terminal thereof connected to one terminal of the first capacitor.

The power detection circuit may further comprise a second adjustment second-conductivity type MOS transistor having a first terminal thereof connected onto the second-potential power line, a second terminal thereof connected to the control terminal of the discharging second-conductivity type MOS transistor, and a control terminal thereof connected to one terminal of the first capacitor.

Further, according to the present invention, there is also provided a power detection circuit comprising a first comparator block comparing a supply voltage with a first threshold value; a charge controller block that includes a charging first-conductivity type MOS transistor having a first terminal thereof connected onto a first-potential power line, a second terminal thereof connected to one terminal of a first capacitor which has the other terminal thereof connected onto a second-potential power line, and a first output signal, which is transferred from the first comparator block, applied to a control terminal thereof so as to control the charging of the first capacitor, and a discharging second-conductivity type MOS transistor having a first terminal thereof connected onto the second-potential power line, a second terminal thereof connected to one terminal of the first capacitor, and a second output signal, which is transferred from the first comparator block, applied to a control terminal thereof so as to control the discharging of the first capacitor, and that controls the charging of the first capacitor according to the output signal of the first comparator block; a second comparator block comparing the charge in the first capacitor with a second threshold value so as to produce a power detection signal; a first adjustment second-conductivity type MOS transistor having a first terminal thereof connected onto the second-potential power line, a second terminal thereof connected to the control terminal of the charging first-conductivity type MOS transistor, and a control terminal thereof connected to one terminal of the first capacitor; and a second adjustment second-conductivity type MOS transistor having a first terminal thereof connected onto the second-potential power line, a second terminal thereof connected to the control terminal of the discharging second-conductivity type MOS transistor, and a control terminal thereof connected to one terminal of the first capacitor.

BRIEF DESCRIPTION OF THE DRAWINGS

The present invention will be more clearly understood from the description of the preferred embodiments as set forth below with reference to the accompanying drawings, wherein:

FIG. 3 is an explanatory diagram concerning the operation of the power detection circuit shown in FIG. 2.

DESCRIPTION OF THE PREFERRED EMBODIMENTS

Before describing in detail the preferred embodiments of the present invention, a conventional power detection circuit and its associated problems will be described with reference to FIG. 1.

Figure 1:
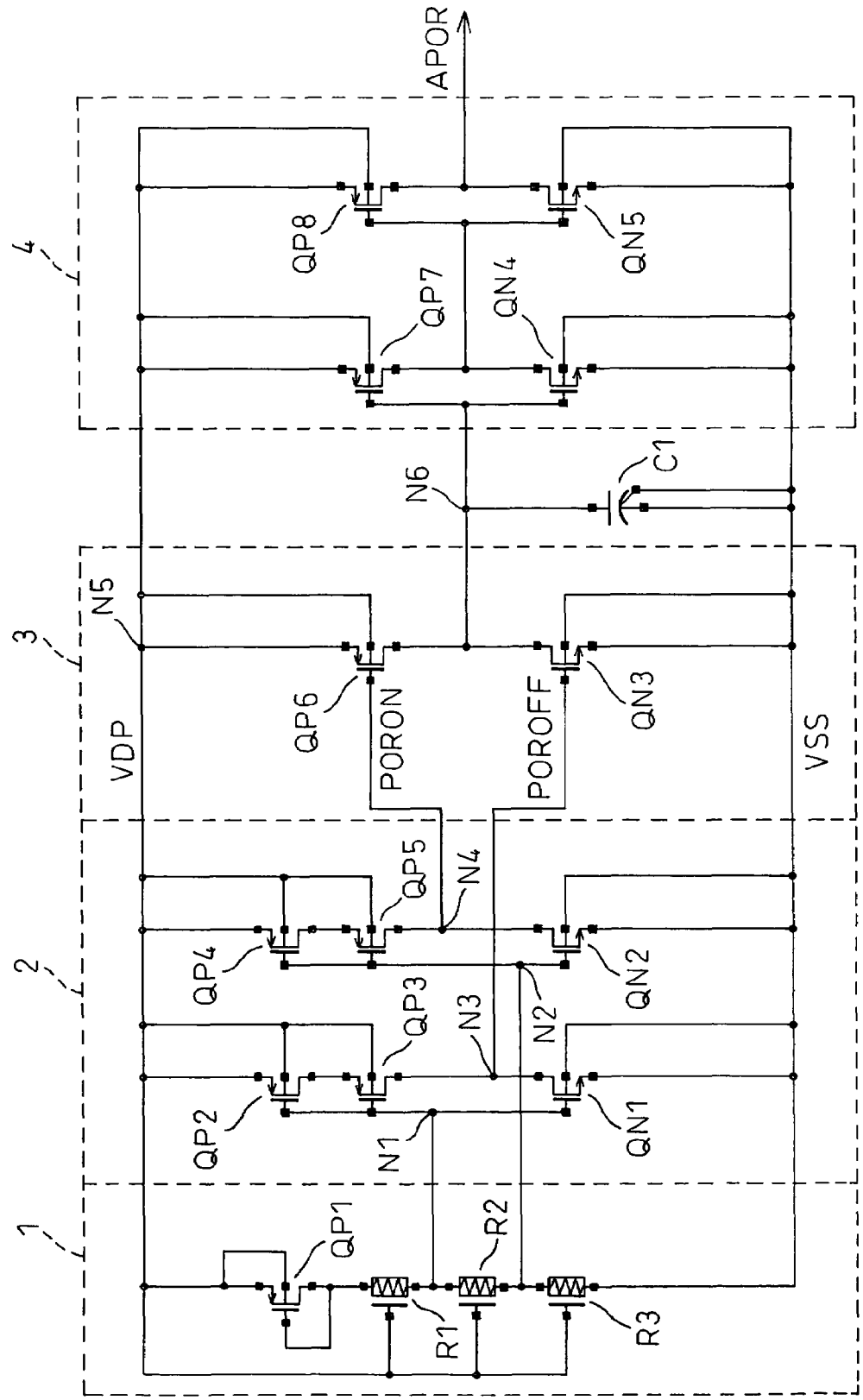
FIG. 1 is a circuit diagram showing an example of a conventional power detection circuit.

FIG. 1 is a circuit diagram showing an example of a conventional power detection circuit. Referring to FIG. 1, there are shown p-channel MOS transistors (PMOS transistors: first-conductivity type transistors) QP1 to QP8, n-channel MOS transistors (NMOS transistors: second-conductivity type transistors) QN1 to QN5, resistors R1 to R3, and a capacitor C1. The PMOS transistors QP2 to QP6 are formed as long-channel transistors.

As shown in FIG. 1, the conventional power detection circuit includes a voltage divider block 1, a first comparator block 2, a charger discharger block 3, a capacitor C1, and a second comparator block 4. The voltage divider block 1 includes the PMOS transistor QP1 and the resistors R1 to R3. The first comparator block 2 includes two inverters realized with the transistors QP2, QP3 and QN1 or the transistors QP4, QP5, and QN2. After a power supply is turned on, a supply voltage VDP that gradually rises is divided into fractional voltages by the resistors included in the voltage divider block 1. The two fractional supply voltages are applied to the input terminals of the inverters (node N1 and N2), and compared with the threshold voltages of the inverters. A discharge control signal (first output signal) POROFF and a charge control signal (second output signal) PORON are transmitted via the output terminals of the respective inverters.

The charger discharger block 3 includes: a charging PMOS transistor QP6 that has a source (first terminal) thereof connected onto a high-potential power line (first-potential power line VDP), that has a drain (second terminal) thereof connected to a node N6 (one terminal of the capacitor C1 having the other terminal thereof connected onto a low-potential power line (second-potential power line VSS)), and that has the signal PORON applied to the gate (control terminal) thereof so as to control charging of the capacitor C1; and a discharging NMOS transistor QN3 that has a source thereof connected onto the low-potential power line (VSS), that has a drain thereof connected to the node N6, and that has the signal POROFF applied to the gate thereof so as to control discharging of the capacitor C1. The second comparator block 4 includes two inverters, that is, an inverter that receives a voltage which develops at the node N6 leading to the capacitor C1, compares the voltage with a predetermined threshold voltage, and that includes the transistors QP7 and QN4, and an inverter that buffers the output of the inverter composed of the transistors QP7 and QN4, and that includes the transistors QP8 and QN5.

As mentioned above, the PMOS transistors QP2 to QP5 constituting the inverters included in the first comparator block 2 are long-channel transistors. Due to input voltages (voltages developing at the nodes N1 and N2 respectively) that do not fully swing to the voltage level on the power line VDP, the inverters suppress flowing currents without cutting them off. The two transistors QP2 and QP3 or QP4 and QP5 are connected in series with each other as the PMOS transistors constituting each of the inverters. This is because if each of the inverters were realized with one transistor, the length of a channel in the transistor would become too long. This makes it hard to manufacture the power detection circuit. Logically, only one transistor is needed to realize each of the inverters. In an actual circuit, each of the two PMOS transistors QP2 and QP3 or QP4 and QP5 that are connected in series of each other may be realized with one PMOS transistor or three or more PMOS transistors.

Moreover, the PMOS transistor QP6 to be controlled with the signal PORON has a long channel. This is intended to increase a time constant required by a delay circuit composed of the PMOS transistor QP6, which acts as a resistor that opposes the flow of a current to the capacitor C1.

Specifically, when the power supply is turned on, the potential on the power line VDP rises. However, since a current hardly flows through the node N5 leading to the long-channel PMOS transistor QP6, the signals POROFF and PORON (potentials at the nodes N3 and N4 respectively) are nearly retained at the same voltage level as the voltage level on the power line VSS. Consequently, the PMOS transistor QP6 that is controlled with the signal PORON starts charging the capacitor C1.

With the passage of time, the signals POROFF and PORON rise with the charge supplied from the long-channel PMOS transistors QP2 and QP3 or QP4 and QP5. The potentials at the nodes N1 and N2 respectively that control the respective inverters included in the first comparator block 2 reach the threshold values of the respective inverters. Consequently, the potentials at the nodes N3 and N4 (signals POROFF and PORON) become equal to the voltage level on the power line VSS.

Thereafter, the potential at the node N6 leading to the capacitor C1 reaches the threshold value of the inverter composed of the transistors QP7 and QN4 and included in the second comparator block 4 of the next stage. This causes the output of the inverter to make a transition from a high level to a low level. Furthermore, a Power On Reset signal APOR that makes a transition from the low level to the high level is produced via the inverter composed of the transistors QP8 and QN5.

Thereafter, if the potential on the power line VDP drops, the signal PORON (node N4) makes a transition from the low level to the high level due to a potential difference between the nodes N1 and N2. Thereafter, the signal POROFF (node N3) makes a transition from the low level to the high level, whereby the capacitor C1 is discharged. When the potential at the node N6 leading to the capacitor C1 falls below the threshold value of the inverter composed of the transistors QP7 and QN4 included in the next stage, the signal APOR that makes a transition from the high level to the low level is produced. The potential difference between the nodes N1 and N2 controls the hysteresis of the power detection circuit shown in FIG. 1.

As mentioned above, in the conventional power detection circuit shown in FIG. 1, after the power supply is turned on, the inverters that are composed of the transistors QP2, QP3, and QN1 or the transistors QP4, QP5, and QN2, that are included in the first comparator block 2, and that receive the signals which develop at the nodes N1 and N2 respectively and which are fractions of a supply voltage require much time to make a transition to an expected state (an output has a low level), though it depends on the rise of the supply voltage. Therefore, the NMOS transistor QN3 that is included in the charger discharger block 3 and receives the output signal POROFF of the inverter included in the first comparator block 2 may be turned on, and the PMOS transistor QP6 that is included in the charger discharger block 3 and receives the output signal POROFF of the inverter included in the first comparator block 2 may be turned off. When the PMOS transistor QP6 is turned off, the capacitor C1 is not charged. Furthermore, when the NMOS transistor QN3 is turned on, the capacitor C1 is discharged. Consequently, the Power On Reset signal (APOR) may not be produced.

For example, when a supply voltage rises quite slowly, the slow rise cannot be fully handled and the Power On Reset signal may not be produced.

Incidentally, the signal APOR produced by the power detection circuit is a Power On Reset signal (POR signal) that affects an entire system. Unless the APRO signal is produced, the system may start imperfectly.

A problem associated with the conventional power detection circuit shown in FIG. 1 is that the potentials at the nodes N3 and N4 (signals POROFF and PORON) gradually rise. The gradual rise is presumably controlled by, for example, adding a capacitive load to the nodes N3 and N4 so as to increase a charging time.

However, unless a load capacitor is incorporated in each of the nodes N3 and N4, the nodes N3 and N4 do not function. Furthermore, the node N3 (signal POROFF) should respond quickly to a fall of a supply voltage. However, the incorporation of the load capacitor cannot be said to be preferable because it lowers a response speed.

Prior to description of a power detection circuit according to an embodiment of the present invention, the special features of the present invention will be outlined below.

In a power detection circuit in accordance with the present invention, a load capacitor (capacitor C2) is interposed between a node N40 (node N4) and a node N60 (node N6) in order to prevent the potential at the node N4 (charge control signal PORON), which is included in the circuit shown in FIG. 1, from gradually rising when the power supply is turned on.

Furthermore, a first adjustment NMOS transistor QN6 to which the potential at the node N60 is fed back is interposed between the node N40 and the low-potential power line VSS in order to actively prevent the signal PORON from gradually rising. Likewise, a second adjustment NMOS transistor QN7 to which the potential at the node N60 is fed back is interposed between the node N30 and the low-potential power line VSS in order to actively prevent the discharge control signal POROFF from gradually rising.

Consequently, the power detection circuit can cope with a wide range of rise times, which are needed by a supply voltage obtained from the power supply when the power supply is turned on, without a variation in a detectable level of the supply voltage, degradation in detection sensitivity, and an increase in power consumption that is caused by an added circuit and cannot be ignored. Furthermore, since the NMOS transistors QN6 and QN7 are used to adjust the driving ability of the charging PMOS transistor QP6, an input voltage level will not slowly vary near the threshold value of the inverter (in other words, the voltage level at the node N6 will abruptly rise near the threshold value of the inverter composed of the transistors QP7 and QN4). Unnecessary power consumption caused by a penetrating current can be suppressed.

Below, an embodiment of a power detection circuit according to the present invention will be described in detail with reference to the accompanying drawings.

Figure 2:
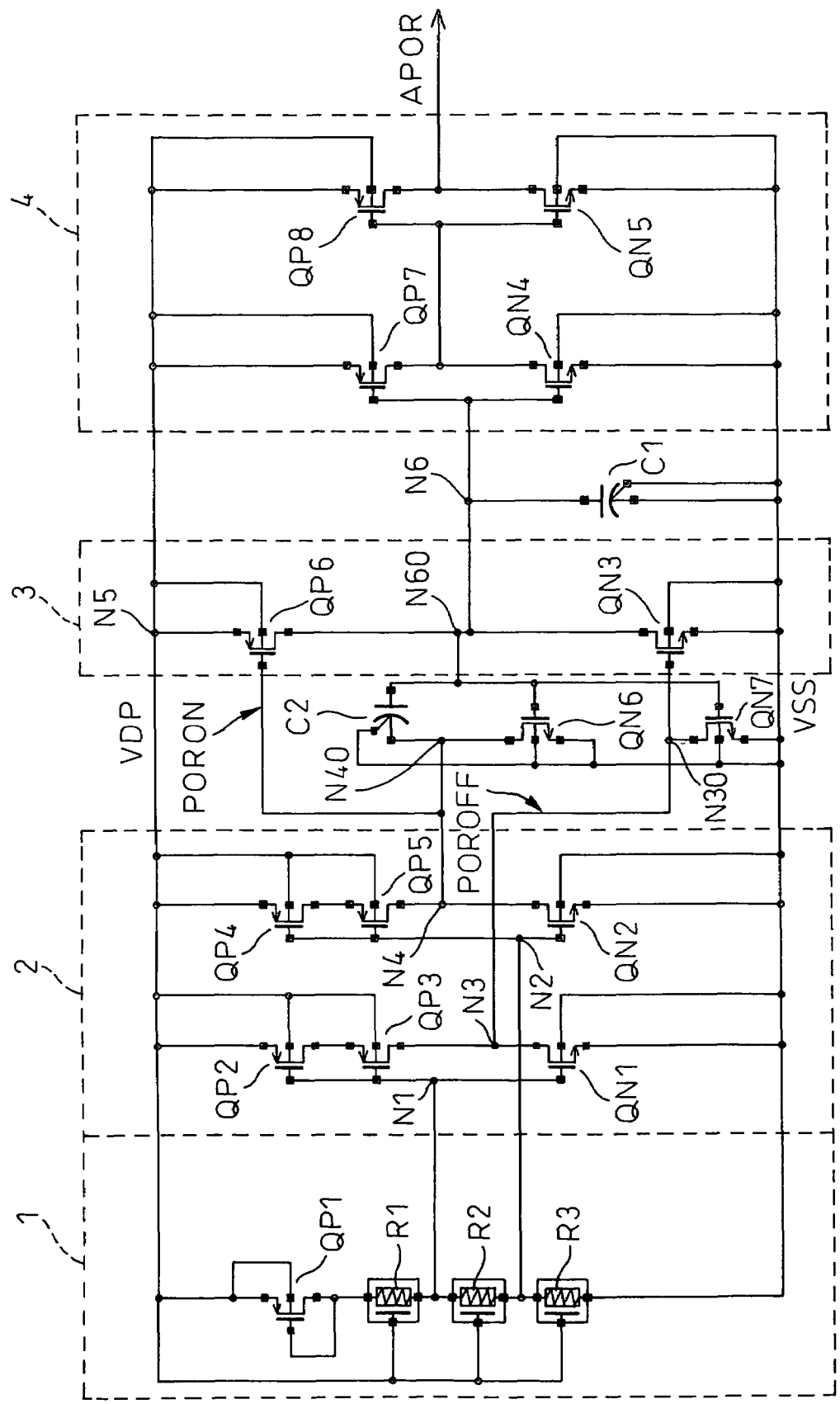
FIG. 2 is a circuit diagram showing an embodiment of a power detection circuit in accordance with the present invention.

FIG. 2 is a circuit diagram showing a power detection circuit in accordance with an embodiment of the present invention.

As apparent from the comparison of FIG. 2 with FIG. 1, the power detection circuit in accordance with the present embodiment includes, in addition to the same circuit elements as those of the conventional power detection circuit shown in FIG. 1, a second capacitor C2 and first and second adjustment NMOS transistors QN6 and QN7.

Specifically, as shown in FIG. 2, the second capacitor C2 is connected between a node N40 (N4) to which a signal PORON is transferred and a node N60 (N6) to which the potential in the first capacitor C1 is applied. The sources (first terminals) of the NMOS transistors QN6 and QN7 are connected onto a low-potential power line VSS. The drain (second terminal) of the NMOS transistor QN6 is connected to the node N40, and the drain of the NMOS transistor QN7 is connected to a node N30 (N3) to which a signal POROFF is transferred. The gates (control terminals) of the NMOS transistors QN6 and QN7 are connected to the node N60 (N6).

In the present embodiment, since the presence of the capacitor C2 increases a load capacitance offered by the node N40 (N4: signal PORON), the gradual rise of the potential at the node N40 can be prevented. Herein, the second capacitor C2 has one of the electrodes thereof connected to the node N60 (N6). As the charging of the first capacitor C1 progresses, a potential difference between the electrodes of the capacitor is nullified. Consequently, the first capacitor C1 does not function as a capacitor. Eventually, the charge being held in the second capacitor C2 moves to the first capacitor C1 and is thus reused.

Furthermore, the NMOS transistor QN6 having the potential at the node N60 (N6) fed back to the gate thereof is interposed between the node N40 (signal PORON) and the low-potential power line VSS. When the second capacitor C2 cannot any longer prevent a gradual rise, the potential at the node N40 is forcibly clamped to the same voltage level as the voltage level on the low-potential power line VSS. Consequently, the driving ability of the charging PMOS transistor QP6 to be controlled with the potential at the node N40 (signal PORON) can be maximized for a short period of time. Eventually, the potential at the node N6 leading to the first capacitor C1 can be abruptly raised without being stagnated near the threshold value of the next-stage inverter (composed of the transistors QP7 and QN4). Thus, the power consumption caused by a current penetrating through the inverter can be suppressed.

Likewise, the NMOS transistor QN7 having the potential at the node N60 fed back to the gate thereof is interposed between the node N30 (signal POROFF) and the low-potential power line VSS, whereby the potential at the node N30 is clamped to the same voltage level as the voltage level on the low-potential power line VSS. As for the node N30, since the node N30 is devoid of a capacitor that prevents a gradual rise, the potential at the node N30 may rise depending on the rise of a supply voltage. If the gradual rise were not prevented, the discharging NMOS transistor QN3 would be turned on. Consequently, the first capacitor C1 would not be charged. However, the presence of the NMOS transistor QN7 resolves this drawback.

As mentioned above, even when the power detection circuit in accordance with the present invention includes the aforesaid second capacitor C2 but does not include the adjustment NMOS transistors QN6 and QN7 or even when the power detection circuit in accordance with the present invention does not include the second capacitor C2 but includes the adjustment NMOS transistors QN6 and QN7, the power detection circuit provides specific advantages.

FIG. 3 is an explanatory diagram concerning the operation of the power detection circuit shown in FIG. 2. FIG. 3 shows a mere example. The voltage values indicated on the axis of ordinates and the time values indicated on the axis of abscissas are provided as a mere example.

As shown in FIG. 3, for example, the potentials at the node N30 (N3: discharge control signal POROFF) and node N40 (N4: charge control signal PORON) gradually rise until about 100 is elapses. This is because, in the power detection circuit shown in FIG. 2, the signals developing at the nodes N1 and N2 and corresponding to fractional voltages of a supply voltage produced by the voltage divider block 1 do not reach the threshold values of the inverters composed of the transistors QP2, QP3, and QN1 or the transistors QP4, QP5, and QN2 and included in the first comparator block 2. Therefore, the PMOS transistors QP2 and QP3 or QP4 and QP5 supply charge. Moreover, referring to FIG. 3, the potential at the node N30 (signal POROFF) drops to the same voltage level as the voltage level on the low-potential power line VSS earlier than the potential at the node N40 does. This is because the potential at the node N3 that is provided as the discharge control signal POROFF is higher than the potential at the node N4 that is provided as the charge control signal PORON.

Within the time indicated in FIG. 3, the effect of the NMOS transistor QN7 on the node N30 (signal POROFF) is not observed.

When the potential at the node N6 (N60) leading to the first capacitor C1 exceeds 0.5 V, the NMOS transistor QN6 connected to the node N40 is turned on. Consequently, the node N40 is forcibly discharged. Eventually, the potential at the node N40 rapidly drops to the same voltage level as the voltage level on the low-potential power line VSS.

The reason why the potential at the node N40 falls more rapidly than the potential at the node N30 does is that the NMOS transistor QN6 works properly. Unless the NMOS transistor QN6 works properly, the potential at the node N40 (signal PORON) slowly drops to the same level as the level on the low-potential power line VSS as indicated with a dashed line PL1 in FIG. 3. The potential in the first capacitor C1 having received the charge control signal PORON slowly rises as indicated with a dashed line PL2. In other words, if the NMOS transistor QN6 were not included, the time which the Power On Reset signal APOR needs to cross the node N6 leading to the first capacitor C1 would get longer. Consequently, the current penetrating through the inverter that is composed of the transistors QP7 and QN4 and receives the potential at the node N6 would flow for a long period of time. Eventually, the power consumption would increase.

As mentioned above, according to the power detection circuit in which the present invention is implemented, since the power detection circuit includes the second capacitor C2, the power detection circuit can cope with a wide range of rise times, which is needed by a supply voltage obtained from a power supply when the power supply is turned on, without such demerits as a variation in the detectable level of a supply voltage, degradation in detection sensitivity, and an increase in power consumption which is caused by an added circuit and which cannot be ignored. Furthermore, owing to the inclusion of the NMOS transistors QN6 and QN7, once the driving ability of the PMOS transistor QP6 is adjusted, the level of an input voltage will not slowly vary near the threshold value of an inverter. Consequently, unnecessary power consumption caused by a penetrating current can be suppressed.

The present invention can be adapted to a power detection circuit to be incorporated in a non-contact IC card or an RFID tag. However, the present invention is not limited to the non-contact IC card and RDID tag but can be applied to various pieces of electronic equipment.

Many different embodiments of the present invention may be constructed without departing from the scope of the present invention, and it should be understood that the present invention is not limited to the specific embodiments described in this specification except as defined in the appended claims.

What is claimed is:

1. A power detection circuit comprising:
a first comparator block comparing a supply voltage with a first threshold value;
a first capacitor having first and second terminals;
a charge controller block controlling the charging of said first capacitor according to an output signal of said first comparator block;
a second comparator block comparing a voltage in said first capacitor with a second threshold value so as to produce a power detection signal; and
a second capacitor having first and second terminals,
wherein said charge controller block includes a charging first-conductivity type MOS transistor having a first terminal thereof connected onto a first-potential power line, a second terminal thereof connected to the first terminal of said first capacitor, and a control terminal thereof receiving a first output signal transferred from said first comparator block;
the second terminal of said first capacitor is connected to a second-potential power line; and
the first terminal of said second capacitor is connected to the control terminal of said charging first-conductivity type MOS transistor, and the second terminal of said second capacitor is connected to the second terminal of said charging first-conductivity type MOS transistor.

2. The power detection circuit as claimed in claim 1, further comprising a voltage divider block dividing the supply voltage using resistors so as to provide first-potential and second-potential signals.

3. The power detection circuit as claimed in claim 2, wherein said first comparator block includes a first inverter comparing the first potential with a threshold voltage so as to provide a charge control signal, and a second inverter comparing the second potential with a threshold voltage so as to provide a discharge control signal.

4. The power detection circuit as claimed in claim 1, further comprising a first adjustment second-conductivity type MOS transistor having a first terminal thereof connected onto said second-potential power line, a second terminal thereof connected to the control terminal of the charging first-conductivity type MOS transistor, and a control terminal thereof connected to one terminal of said first capacitor.

5. The power detection circuit as claimed in claim 1, wherein said charge controller block includes a discharging second-conductivity type MOS transistor having a first terminal thereof connected onto said second-potential power line, a second terminal thereof connected to one terminal of said first capacitor, and a second output signal, which is transferred from said first comparator block, applied to a control terminal thereof so as to control the discharging of said first capacitor.

6. The power detection circuit as claimed in claim 5, further comprising a second adjustment second-conductivity type MOS transistor having a first terminal thereof connected onto said second-potential power line, a second terminal thereof connected to the control terminal of the discharging second-conductivity type MOS transistor, and a control terminal thereof connected to one terminal of said first capacitor.

* * * * *